United States Patent [19]

Ely

[11] Patent Number: 4,654,892
[45] Date of Patent: Mar. 31, 1987

[54] ELECTRO-OPTICAL SYSTEM USING LIGHT MODULATION

[75] Inventor: Richard I. Ely, Flemington, N.J.

[73] Assignee: Burroughs Corporation, Detroit, Mich.

[21] Appl. No.: 723,281

[22] Filed: Apr. 15, 1985

[51] Int. Cl.⁴ .................................................. H04B 9/00
[52] U.S. Cl. .............................. 455/617; 250/214 A; 330/59; 330/291; 330/308; 455/619
[58] Field of Search ........ 250/214 R, 214 A, 214 AG, 250/214 C; 307/311; 330/59, 156, 291, 308; 455/619, 617

[56] References Cited

U.S. PATENT DOCUMENTS

| | | | |
|---|---|---|---|
| 3,523,189 | 8/1970 | Hansen et al. | 250/211 J |
| 3,850,809 | 11/1974 | Mannonen | 250/214 A |
| 4,150,284 | 4/1979 | Trenkler et al. | 455/608 |
| 4,188,550 | 2/1980 | Lum | 250/211 J |
| 4,306,145 | 12/1981 | Hill | 330/308 |

OTHER PUBLICATIONS

Berding-Low Input Capacitance Isolating Circuit-IBM Tech. Disclosure Bull-vol. 9, No. 11, Apr. 1967, p. 1657.

*Primary Examiner*—Joseph A. Orsino, Jr.
*Attorney, Agent, or Firm*—Mark T. Starr

[57] ABSTRACT

An electro-optical system includes a phototransistor having collector and emitter electrodes and adapted to receive modulated light representing data and generating current in a current flow path representative of the received light. A load is placed in the current flow path and generates a voltage due to the current flow, and means are provided for sensing the generated voltage and using that voltage in a feedback circuit to the phototransistor to maintain the collector base junction voltage of the phototransistor constant.

16 Claims, 2 Drawing Figures

ELECTRO-OPTICAL SYSTEM USING LIGHT MODULATION

BACKGROUND OF THE INVENTION

Electro-optical systems are used for data-handling, and they utilize modulated light as part of the data-handling process. In these circuits, data signals modulate light which is received by a phototransistor which, in turn, provides an output electrical signal. The output signal is utilized in any suitable associated apparatus.

These circuits operate generally satisfactorily; however, the limitation on the speed of response of the phototransistor limits the bandwidth of the circuit.

The present invention provides improved speed of response of a phototransistor.

DESCRIPTION OF THE INVENTION

Figure 1:
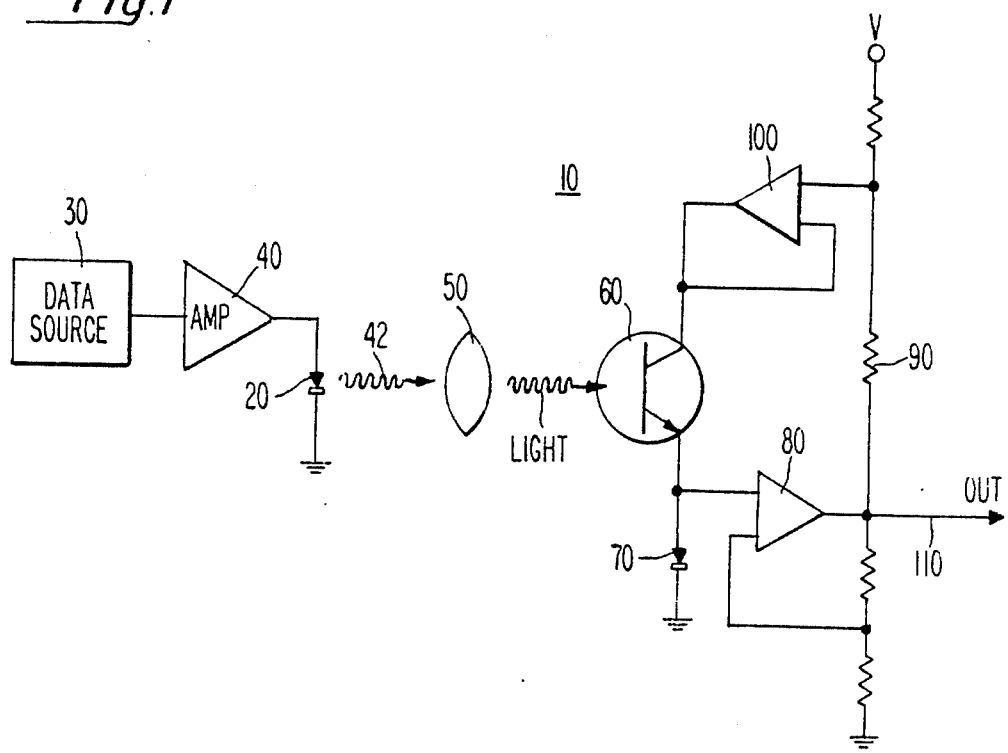
FIG. 1 is a schematic circuit embodying the invention.

A circuit 10 embodying the invention includes a light generator, such as a light-emitting diode (LED) 20, to which a data source 30, an amplifier 40, and any other required circuitry is connected. The output of the LED is a light beam 42 which is modulated by signals from the data source 30. The modulated light output 42 from the LED 20, is coupled by a lens or a fiber optic system 50 or the like to the input of a phototransistor 60, such as an MFOD72. The emitter of the phototransistor 60 is connected to a diode 70 (1N914), oriented as shown, and selected because it has characteristics similar to that of the base-emitter junction of the phototransistor 60. The emitter of the phototransistor 60 is also connected to the input of an amplifier 80, the output of which is coupled through a resistive path 90 to the input of a second amplifier 100 whose output is connected to the collector of the phototransistor 60. The two amplifiers 80 and 100 comprise a positive feedback loop for the phototransistor 60. An output lead 110 also runs from the output of amplifier 80.

According to the theory of operation of the circuit 10, the light current generated in the collector-base junction of the phototransistor 60 flows both into its base-emitter junction and its collector-base capacitor Ccb. Only the current that flows into the base-emitter junction generates emitter current. The response time of the phototransistor then is determined by how long it takes Ccb to charge up or down. If the collector-base junction voltage were held constant, then Ccb would not have to charge up or down and the response time would be fast.

According to the invention, the collector-base voltage can be held constant by measuring any change in the base voltage of the phototransistor 60 and applying an equal amount of positive feedback to its collector junction. Since the base junction of most phototransistors is not connected, a diode 70 and a high input impedance amplifier 80 are connected to the emitter of the phototransistor 60. Then all the emitter current of the phototransistor 60 flows through the diode 70. When the emitter current changes, the voltage across the diode 70 changes by an amount proportional to that of the base-emitter junction. In circuit 10, amplifier 80 amplifies the voltage across the diode 70. The resistor chain 90 reduces this signal somewhat, and amplifier 100 applies the resultant voltage to the collector of phototransistor 60. By setting the total gain of the amplifier system so that the output voltage of amplifier 100 changes by an amount equal to the change in voltage of the base of the phototransistor 60, the collector-base voltage will remain constant.

Figure 2:
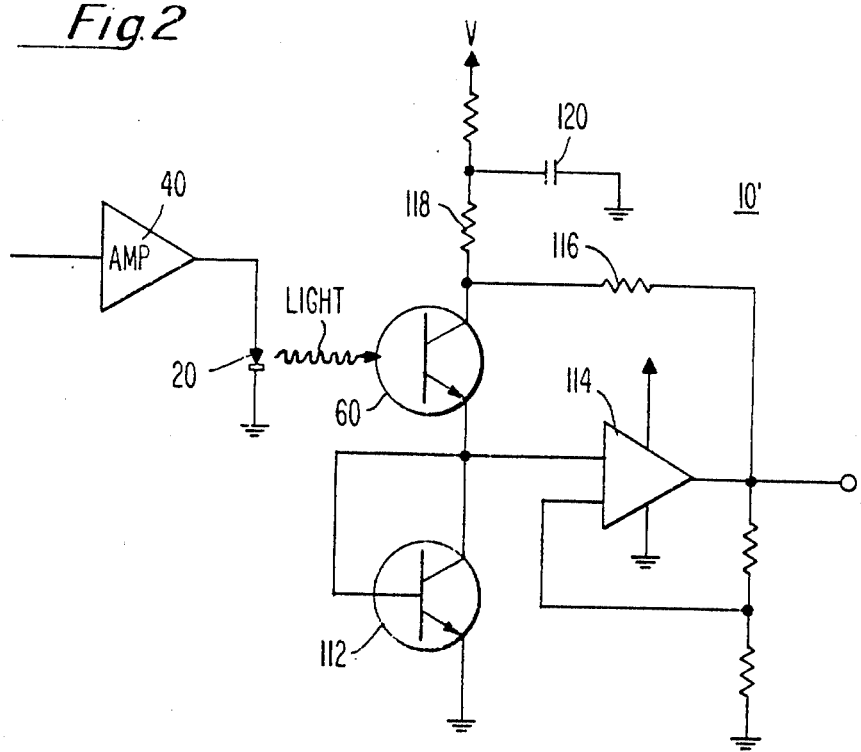
FIG. 2 is a schematic circuit of a modification of the invention.

In circuit 10' shown in FIG. 2, which is a modification of the invention, the data source 30, amplifier 40, and LED 20 are provided to generate a modulated light output which is directed at phototransistor 60. In this circuit, the emitter of the phototransistor 60 is connected both to a transistor 112 which is wired to function as a diode and the input of an amplifier 114, the output of which is connected back through a resistive path 116 to the collector of phototransistor 60. The collector of the phototransistor is coupled through a resistive path 118 to a power source V and through a capacitor 120 to ground.

The operation of circuit 10' is similar to that of circuit 10, except only one amplifier is used. There is an additional resistor 122 and capacitor 120 which are added to filter out voltage supply noise. These may be omitted. The advantage of this circuit over that of circuit 10 is that it eliminates the cost of one amplifier.

One aspect of the invention which is advantageous relates to the use of a diode as a load for the phototransistor. The characteristics of a diode are such that the bias current through the diode, $I_E$, sets its dynamic impedance. If a small modulating current 2E is added to $I_E$ and their ratio remains constant, then the dynamic voltage across the diode will remain constant.

What is claimed is:

1. A system comprising:
   a source of modulated data;
   modulated light means, responsive to said data source, for providing a modulated light output corresponding to said modulated data; and
   current flow means, responsive to said modulated light output, for providing a current flow corresponding to said modulated light output, said current flow means comprising
   a light responsive transistor,
   a diode coupled between the emitter of said light responsive transistor and ground,
   a first amplifier circuit having an input and an output, said first amplifier circuit including a first amplifier having first and second inputs and an output, the first input to said first amplifier connected to the emitter of said light responsive transistor, the output of said first amplifier coupled via a first resistive element to the second input of said first amplifier, and
   a second amplifier circuit having an input and an output, the input to said second amplifier circuit coupled to the output of said first amplifier circuit, the output of said second amplifier circuit coupled to the collector of said light responsive transistor.

2. The system according to claim 1 wherein said modulated light means includes:
   a light emitting diode coupled and responsive to said modulated data source; and
   guide means for directing the light output of said light emitting diode onto said light responsive transistor.

3. The system according to claim 1 wherein said second amplifier circuit includes:

a second amplifier having first and second inputs and an output, the first input to said second amplifier coupled through a second resistive element to the output of said first amplifier, the second input and output of said second amplifier both connected to the collector of said light sensitive transistor.

4. The system according to claim 3 further including a third resistive element connected between the second input to said first amplifier and ground.

5. The system according to claim 4 further including a fourth resistive element connected between the first input to said second amplifier and a fixed voltage level.

6. The system according to claim 3 wherein said modulated light means includes:
   a light emitting diode coupled and responsive to said modulated data source; and
   guide means for directing the light output of said light emitting diode onto said light responsive transistor.

7. The system according to claim 6 wherein said guide means includes a lens positioned between said light emitting diode and said light responsive transistor.

8. The system according to claim 6 wherein said guide means includes a fiber optic cable coupled between said light emitting diode and said light responsive transistor.

9. The system according to claim 6 wherein said light responsive transistor is a phototransistor.

10. A system comprising:
    a source of modulated data;
    modulated light means, responsive to said data source, for providing a modulated light output corresponding to said modulated data; and
    current flow means, responsive to said modulated light output, for providing a current flow corresponding to said modulated light output, said current flow means comprising
    a light responsive transistor,
    a diode coupled between the emitter of said light responsive transistor and ground,
    a first amplifier circuit having an input and an output, the input to said first amplifier circuit coupled to the emitter of said light responsive transistor, and
    a second amplifier circuit having an input and an output, the input to said second amplifier circuit coupled to the output of said first amplifier circuit, the output of said second amplifier circuit coupled to the collector of said light responsive transistor, said second amplifier circuit including an amplifier having first and second inputs and an output, the first input to said amplifier coupled through a resistive element to the output of said first amplifier circuit, the second input and output of said amplifier both connected to the collector of said light sensitive transistor.

11. A system comprising:
    a source of modulated data;
    modulated light means, responsive to said data source, for providing a modulated light output corresponding to said modulated data; and
    current flow means, responsive to said modulated light output, for providing a signal corresponding to said modulated light output, said current flow means including
    a light responsive transistor,
    a first transistor, the base and collector of said first transistor both connected to the emitter of said light responsive transistor, the emitter of said first transistor grounded, and
    an amplifier having first and second inputs and an output, the first input to said amplifier connected to the emitter of said light responsive transistor, the output of said amplifier coupled via a first resistive element to the collector of said light responsive transistor, the output of said amplifier further coupled through a second resistive element to the second input of said amplifier, the second input to said amplifier coupled via a third resistive element to ground, the collector of said light responsive transistor coupled via a fourth resistive element to a constant voltage.

12. The system according to claim 11 further including a fifth resistive element coupled between said fourth resistive element and said constant voltage and a capacitor connected between ground and the junction of said fourth and fifth resistive elements.

13. The system according to claim 11 wherein said modulated light means includes:
    a light emitting diode coupled and responsive to said modulated data source; and
    guide means for directing the light output of said light emitting diode onto said light responsive transistor.

14. The system according to claim 13 wherein said guide means includes a lens positioned between said light emitting diode and said light responsive transistor.

15. The system according to claim 13 wherein said guide means includes a fiber optic cable coupled between said light emitting diode and said light responsive transistor.

16. The system according to claim 13 wherein said light responsive transistor is a phototransistor.

* * * * *